United States Patent [19]

Clifford et al.

[11] 4,278,988

[45] Jul. 14, 1981

[54] SEMICONDUCTOR DEVICE FOR PROVIDING A SELECTABLE REFERENCE VOLTAGE

[75] Inventors: James A. Clifford, San Diego; Daniel E. Pearson, La Jolla, both of Calif.

[73] Assignee: Burroughs Corporation, Detroit, Mich.

[21] Appl. No.: 118,616

[22] Filed: Feb. 4, 1980

[51] Int. Cl.$^3$ .................... H01L 27/02; H01L 29/78
[52] U.S. Cl. ........................... 357/51; 357/23; 357/22; 357/41
[58] Field of Search .................. 357/23, 22, 41, 51

[56] References Cited

U.S. PATENT DOCUMENTS

| | | | |
|---|---|---|---|
| 4,068,134 | 1/1978 | Tobey, Jr. et al. | 307/297 |
| 4,170,818 | 10/1979 | Tobey, Jr. et al. | 29/57 |

OTHER PUBLICATIONS

Millman et al., Pulse, *Digital and Switching Waveforms,* McGraw-Hill Co., 1965, pp. 3-4.
Carr et al., MOS/LSI Design and Applications, McGraw-Hill, 1972, pp. 107-108, 109-110, 125, 126.
MOS Aid Inc., Circuit Diagram of Mostek Part No. MK4116, Apr. 8, 1978.

*Primary Examiner*—Martin H. Edlow
*Attorney, Agent, or Firm*—Charles J. Fassbender; Kevin R. Peterson

[57] ABSTRACT

The disclosed semiconductor device is comprised of a substrate having a major surface; a channel having an elongated portion of a first predetermined length $L_1$ and a uniform width W in the substrate near the surface; a single gate completely overlying the channel; and a conductive region in the substrate near the surface contacting the elongated portion of the channel at a predetermined length $L_2$ from one end thereof. The conductive region picks off a reference voltage from the channel as a function of the ratio $L_1/L_2$.

10 Claims, 7 Drawing Figures

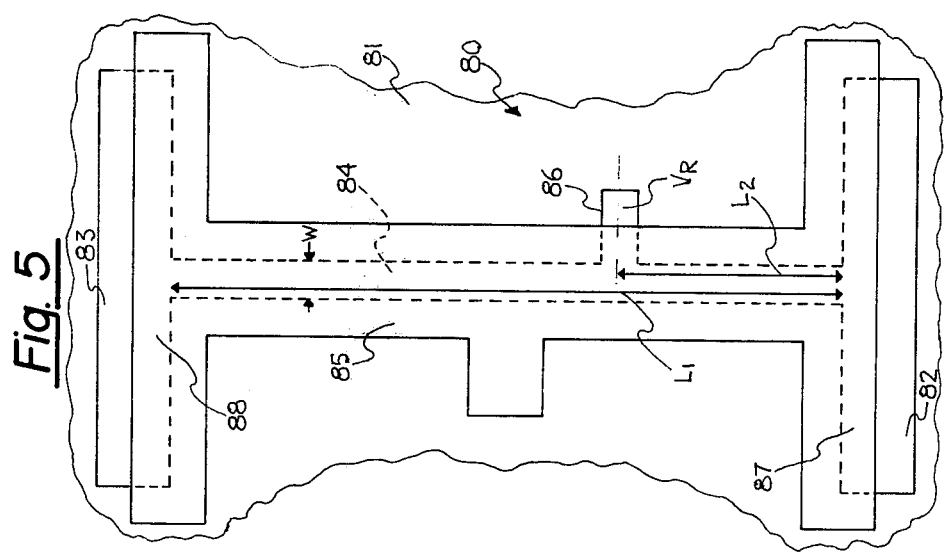
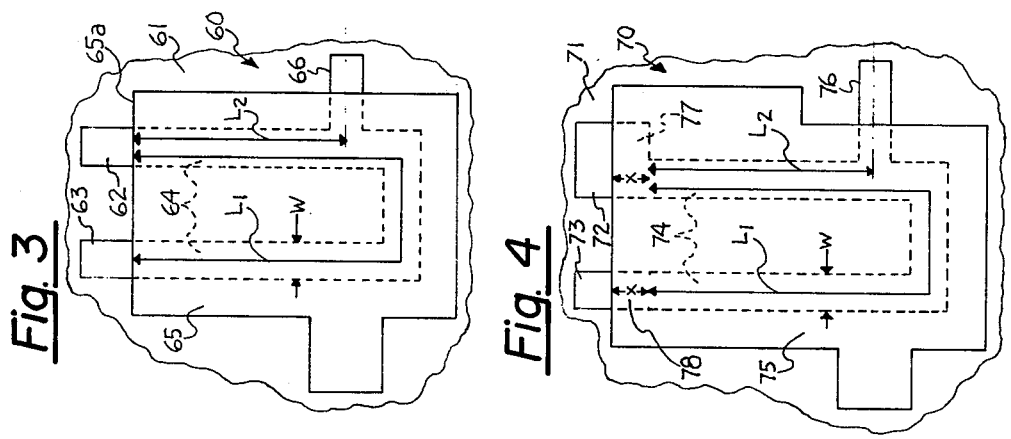
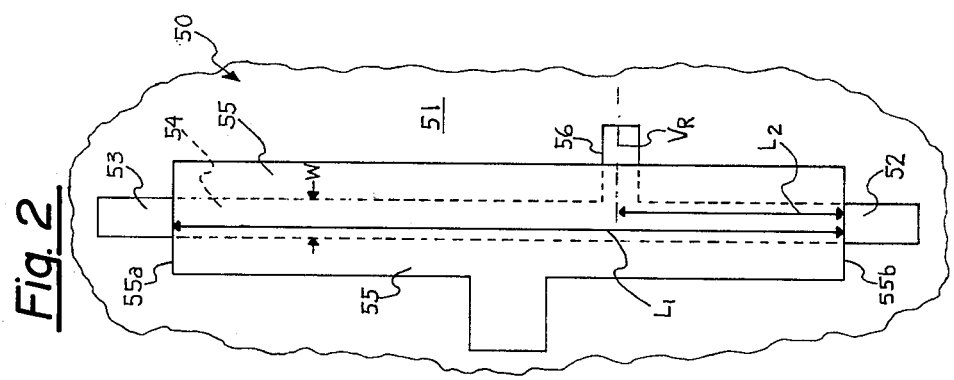

SEMICONDUCTOR DEVICE FOR PROVIDING A SELECTABLE REFERENCE VOLTAGE

BACKGROUND OF THE INVENTION

This invention relates to integrated electronic circuits which require a reference voltage for their operation, and more particularly to means for providing a selectable reference voltage for those circuits. One particular example of such a circuit and a prior art means for providing the reference voltage is illustrated in FIG. 1a. In that figure, the circuit is indicated by reference numeral 10, and the reference voltage generating means is indicated by reference numeral 20.

That particular circuit is a balanced differential amplifier. It consists of a total of seven field effect transistors 11-17 which are interconnected as illustrated. Basically, the function of circuit 10 is to receive a $T^2L$ input voltage $V_I$, and to generate an output voltage $V_O$ which indicates whether the input voltage $V_I$ is a logical "1" or a logical "0".

In operation, transistors 11 and 12 are simultaneously turned-on by a clocking singal $\phi_1$. This turn-on charges the source of those transistors to approximately plus five volts. Subsequently, transistors 11 and 12 are turned-off, and transistor 17 is turned-on by a clocking signal $\phi_2$. If signal $V_I$ is more positive than the reference voltage $V_R$, then transistor 16 conducts more than transistor 15. This causes the five volts which was stored at the source of transistor 12 to discharge through transistors 14, 16, and 17. At the same time, transistor 13 turns-off which leaves the voltage at the source of transistor 11 at or near five volts.

Conversely, if the input voltage $V_I$ is less positive than the reference voltage $V_R$, then the operation of circuit 10 is just the opposite. That is, the voltage at the source of transistor 11 is discharged through transistors 13, 15, and 17; while the voltage at the source of transistor 12 remains at or near five volts. This symmetry of operation is due to the fact that circuit 10 is balanced (i.e., transistors 13 and 14 have identical geometries, and transistors 15 and 16 also have identical geometries).

Such symmetry in circuit 10 is highly desirable because it makes the circuit's operation insensitive to tolerances in the fabrication process. For example, if the nominal widths of transistors 13 and 14 are identical, but they both increase uniformly due to various processing tolerances, then the corresponding electrical parameters in transistors 13 and 14 will also be modified identically and their effects will cancel. This will not be the case if circuit 10 is unbalanced (i.e., if the nominal widths of transistors 13 and 14 were not identical).

However, balanced amplifiers always require a reference voltage which is intermediate between the logical "1" and logical "0" voltage levels of the input voltage $V_I$ that is being sensed. This voltage must be precisely generated. Otherwise, if the reference voltage is too low, then some of the input voltages which actually are a logical "0" will be incorrectly interpreted as a logical "1"; or if the reference voltage is generated too high, then some of the input voltages which actually are a logical "1" will be incorrectly interpreted as a logical "0".

Reference voltage generator 20 of the prior art merely consists of a pair of resistors 21 and 22. These resistors may be fabricated on a semiconductor chip as a patterned diffusion in the substrate, or as a patterned polysilicon layer above the substrate. Both of these types of resistors are unattractive however because they require too large of an area for their implementation. Typically, polysilicon resistors provide only 60 ohms per square, and diffusion resistors provide only 20 ohms per square. Thus, a 50 K ohm resistor requires an area of approximately 1,000 squares for its implementation.

A resistance of less than 50 K ohms would of course occupy less space. But smaller resistors also draw more current and consume more power which makes them unsuitable on a chip. For example, given a five volt supply and a current limitation of 100 microamps, a resistor of at least 50 K ohms would be required.

Reference voltage generator 20 is also unattractive because the reference voltage $V_R$ is too sensitive to changes in the plus five volt supply. For example, if the supply voltage changes by a plus or minus ten percent, then the reference voltage $V_R$ will also change by plus or minus ten percent. Preferably, reference voltage $V_R$ should not directly track such changes in the supply voltage.

Another prior art reference voltage generating circuit is illustrated in FIG. 1b. That circuit consists of a pair of unsymmetrical transistors 31 and 32 which are interconnected as illustrated. Transistor 31 has a channel of length $L_A$ and width $W_A$; whereas transistor 32 has a channel of length $L_B$ and width $W_B$. These dimensional parameters are selectively chosen to obtain the desired voltage $V_R$. That is, reference voltage $V_R$ is a function of the quantity $$\left(\frac{L_A}{W_A}\right) \div \left(\frac{L_A}{W_A} + \frac{L_B}{W_B}\right).$$

However, a problem with the FIG. 1b circuit is that reference voltage $V_R$ is too sensitive to variations in the dimensions $L_A$, $L_B$, $W_A$, and $W_B$. If we assume that each dimensional parameter has a tolerance of plus or minus $2e$, then reference voltage $V_R$ is actually a function of $$\left(\frac{L_B \pm 2e}{W_B \pm 2e}\right) \div \left(\frac{L_A \pm 2e}{W_A \pm 2e} + \frac{L_B \pm 2e}{W_B \pm 2e}\right).$$

This dependence on dimensional tolerances can be reduced by setting $W_A$ equal to $W_B$; but even under those conditions, the sensitivity of reference voltage $V_R$ is still too high, as it is a function of $$(L_B \pm 2e) \div (L_A + L_B \pm 4e).$$

Having $V_R$ independent of dimensional tolerances is highly desirable because those tolerances are caused by many processing factors. For example, mask tolerances, resist exposure time tolerances, undercutting tolerances of etchants, and energy level tolerances of dopant atoms each give rise to dimensional tolerances. Thus, practically all of the many steps of a fabrication process for a semiconductor device must be tightly controlled in order to eliminate dimensional tolerances and the corresponding variation in reference voltage $V_R$ from the FIG. 1b reference voltage generator.

Still another prior art reference voltage generator is illustrated in FIG. 1c. It consists of a first plurality of serially interconnected transistors 42-1 through 42-M. All of these transistors are identical. That is, they all have identical channel lengths and identical channel widths. Due to this symmetry, reference voltage $V_R$ is insensitive to dimensional tolerances, and is merely a function of the ratio of the number N of transistors in the first plurality divided by the total number of transistors N+M.

One problem however with the FIG. 1c reference voltage generator is that reference voltage $V_R$ is quantized in increments of (1/N+M). Thus, a large number of transistors is required to obtain any reference voltage precisely. But, this is undesirable because the required chip space is directly proportional to the total number of transistors N+M times their gate length plus the total number of transistors N+M times the spacing between adjacent transistors. Typically, the minimal gate length and the minimal spacing between adjacent transistors are equal to each other. Thus, the latter term significantly adds to the required chip space.

Another problem with the FIG. 1c reference voltage generator is that voltage $V_R$ is sensitive to any mask defect which shortens the gate length of one of the transistors beyond the nominal minimal length. For example, if the gate length of transistor 41-2 is so decreased, then that transistor can short and reference voltage $V_R$ will increase by some increment. Conversely, $V_R$ will decrease by some increment if a mask defect causes one of transistors 42-1 through 42-M to short.

Accordingly, it is a primary object of the invention to generating an improved means for generating a reference voltage on a semiconductor chip.

Another object of the invention is to provide a means for generating a reference voltage on a semiconductor chip which occupies a minimal amount of chip space.

Another object of the invention is to provide a means for providing a reference voltage on a semiconductor chip which has minimal sensitivity to dimensional variations.

Another object of the invention is to provide a means for generating a reference voltage on a semiconductor chip which is not quantized.

Another object of the invention is to provide a means for generating a reference voltage on a semiconductor chip which is relatively insensitive to changes in the supply voltage.

Still another object of the invention is to provide a means for generating a reference voltage on a semiconductor chip which is relatively insensitive to mask defects.

SUMMARY OF THE INVENTION

These and other objects are accomplished in accordance with the invention by a semiconductor device which is comprised of a semiconductor substrate having a major surface; a channel having an elongated portion of a first predetermined length $L_1$ and a uniform width W in the substrate near the surface; a single gate completely overlying the channel; and a conductive region in the substrate near the surface contacting the elongated portion of the channel at a predetermined length $L_2$ from one end thereof. This conductive region picks off a reference voltage from the channel as a function of the ratio $L_1/L_2$.

In one embodiment, the channel has a linear shape, and the gate has a pair of spaced apart sides which are respectively aligned with opposite ends of the channel. Preferably, the linear channel also includes a pair of regions which are substantially wider and substantially shorter than the elongated channel portion and which contact respective ends of the elongated channel portion and extend to opposite sides of the gate.

In another embodiment, the channel is curved such that the gate has one side which aligns with boths ends of the channel. Preferably, the curved channel also includes a region having a width of W $(L_1-L_2)/L_2$ in contact with said one end of said elongated channel portion and extending to the one side of the gate, and another region in the channel having a width W in contact with the opposite end of the elongated channel portion which also extends to the one side of the gate.

BRIEF DESCRIPTION OF THE DRAWINGS

Various features and advantages of the invention will best be understood by reference to the following Detailed Description and accompanying drawings wherein:

FIG. 2 is a plan view illustrating the physical layout of one embodiment of a semiconductor device for providing selectable reference voltages in accordance with the invention.

FIG. 3 is a plan view illustrating the physical layout of a second embodiment of a semiconductor device for providing selectable reference voltages in accordance with the invention.

FIG. 4 is a plan view illustrating the physical layout of a third embodiment of a semiconductor device for providing selectable reference voltages in accordance with the invention.

FIG. 5 is a plan view illustrating the physical layout of a fourth embodiment of a semiconductor device for providing selectable reference voltages in accordance with the invention.

DETAILED DESCRIPTION

Figure 1C:
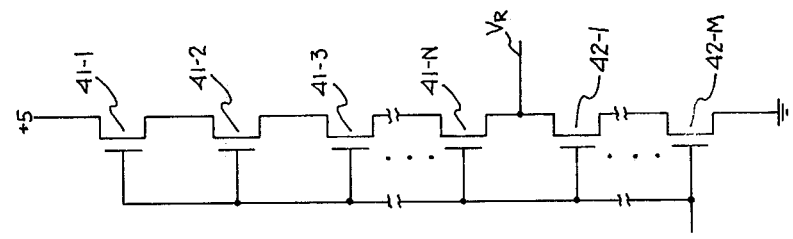
FIGS. 1a–1c are detailed circuit diagrams of prior art means for providing selectable reference voltages on a semiconductor chip.

One preferred embodiment 50 of a semiconductor device for providing a selectable reference voltage $V_R$ in accordance with the invention will now be described in conjunction with FIG. 2. Embodiment 50 is fabricated on a major surface 51 of a semiconductor substrate. It includes a source 52, a drain 53, and an elongated channel 54 of a first predetermined length $L_1$ and uniform width W. A single gate 55 completely overlies channel 54. Also included is a conductive region 56 in the substrate which contacts the elongated channel 54 at a predetermined length $L_2$ from source 52. Conductive region 56 picks off reference voltage $V_R$ from channel 54 as a function of the ratio $L_1/L_2$ of the predetermined lengths.

To understand the nature of that function, consider the following analysis. As a close approximation, the current $I_{L1}$ which flows through length $L_1$ of channel 54 may be expressed mathematically as:

$$I_{L1} = \frac{W}{L_1} 2K' \left\{ [V_{GS} - V_{TL1}]V_{DS} - \frac{V_{DS}^2}{2} \right\}. \quad \text{eq 1}$$

In this equation, W is the width of channel 54, $L_1$ is the length of channel 54, K' is a constant, $V_{GS}$ is the voltage between gate 55 and source 52, $V_{TL1}$ is the threshold voltage of channel 54, and $V_{DS}$ is the voltage between drain 53 and source 52.

Utilizing equation 1, current $I_{L1}$ may be limited to a suitably low quantity (such as 100 microamps) by appropriately choosing the dimensional parameters W and $L_1$. The terms $V_{GS}$ and $V_{DS}$ are dictated by the supply voltages which are available on the chip; and the terms $K'$ and $V_{TL1}$ are also dictated by various processing steps.

Next, one can assume that a "virtual drain" exists in channel 54 at a distance $L_2$ from source 52. Reference voltage $V_R$ is the voltage of that "virtual drain". An expression for the current $I_{L2}$ which flows through this virtual drain may be expressed mathematically as:

$$I_{L2} = \frac{W}{L_2} 2K' \left\{ [V_{GS} - V_{TL2}]V_{RS} - \frac{V_{RS}^2}{2} \right\} . \quad \text{eq 2}$$

In this equation, the parameters W, L2, $K'$, and $V_{GS}$ are as defined above. Voltage $V_{RS}$ is the voltage between conductive region 56 and source 52, and voltage $V_{TL2}$ is the threshold voltage for the "virtual transistor" which is formed by the above described "virtual drain" and the portion of channel 54 of length $L_2$.

Under the condition where conductive region 56 draws no current from the channel 54, current $I_{L2}$ is equal to current $I_{L1}$. That condition will be met so long as conductive region 56 connects to only gates of other external field effect transistors. Setting equations 1 and 2 equal to each other yields the following:

$$\frac{W}{L_1} 2K' \left\{ [V_{GS} - V_{TL1}] V_{DS} - \frac{V_{DS}^2}{2} \right\} = \quad \text{eq 3.}$$

$$\frac{W}{L_2} 2K' \left\{ [V_{GS} - V_{TL2}] V_{RS} - \frac{V_{RS}^2}{2} \right\}$$

By algebraic manipulation, equation 3 may be rewritten in the following form:

$$\frac{L_1}{L_2} = \frac{[V_{GS} - V_{TL1}] V_{DS} - \frac{V_{DS}^2}{2}}{[V_{GS} - V_{TL2}] V_{RS} - \frac{V_{RS}^2}{2}} \quad \text{eq 4.}$$

Thus, a desired reference voltage $V_R$ is obtained by appropriately selecting $L_2$ in accordance with the above $L_1/L_2$ ratio after $L_1$ has been selected to suitably limit the current $I_{L1}$.

This invention is attractive because it overcomes all of the problems which exist in the prior art reference voltage generators as described in the background portion of this disclosure. For example, the prior art reference voltage generator of FIG. 1a requires at least 1,000 squares of chip space in order to limit current to less than 100 microamperes. By comparison, a current of less than 100 microamperes can be achieved with the FIG. 2 embodiment by making W and $L_1$ only 13 and 35 microns respectively. This can readily be shown by utilizing equation 1 with reasonable values for the various parameters contained therein such as $V_{GS}=12$ V, $V_{DS}=5$ V, $V_{TL1}=0.9$ V, and $K'=10$.

Figure 1B:
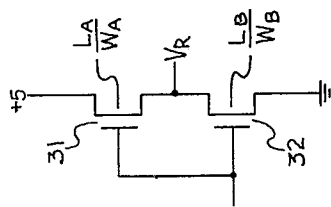
Figure 1A:
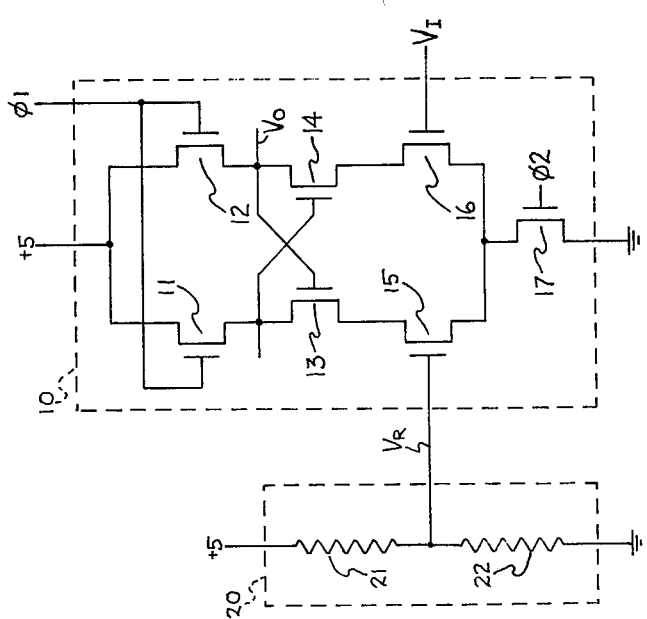

Also in the prior art reference voltage generator of FIG. 1a, reference voltage $V_R$ directly tracks any changes in the supply voltage. This is not the case in the embodiment of FIG. 2. The reason is that drain 53 and the adjacent portion of channel 54 which extends up to conductive region 56 forms a "virtual transistor" whose threshold voltage is proportional to $$\gamma \left( \sqrt{V_{SB} + \phi_S} - \sqrt{\phi_S} \right) .$$

Thus, that threshold voltage increases as $V_{SB}$ increases. But $V_{SB}$ is the voltage between conductive lead 56 and the bulk of the substrate. Thus, as reference voltage $V_R$ rises in response to an increase in voltage on drain 53, the threshold voltage will also rise. This rise in threshold voltage increases the resistance of that portion of channel 54 which lies between drain 53 and conductive lead 56. In turn, that resistance increase lowers reference voltage $V_R$ since a larger portion of the source voltage is dropped in the channel before reaching region 56.

Similarly, the FIG. 2 embodiment of the invention overcomes the problems of the prior art voltage generator of FIG. 1b. That prior art reference voltage generator was undesirable in that the reference voltage $V_R$ was too dependent upon dimensional tolerances. To compare, we must again assume that the overall gate length $L_1$ also has a tolerance of $\pm 2e$. Thus, its edges 55a and 55b of the gate may each move by a distance of $\pm e$ with respect to conductive lead 56. This places the tolerance of $L_2$ at $\pm e$.

Substituting the lengths $L_1$ and $L_2$ with their respective tolerances into the previously described equation 4 (which is the equation for the reference $V_R$ as a function of the lengths $L_1$ and $L_2$) yields $$V_R = f\left( \frac{L_2 \pm e}{L_1 \pm 2e} \right) .$$

Thus, the dependence of the reference voltage $V_R$ on dimensional tolerances is substantially reduced in comparison to the prior art reference voltage generator of FIG. 1b.

Consider next, the prior art reference voltage generator of FIG. 1c. It requires approximately twice as much chip space for its implementation then does the present invention. This is because each of the individual N+M transistors must be spaced apart from one another, and that spacing approximately equals one transistor gate length. Clearly, no such spacing is required in the present invention.

Also, reference voltage $V_R$ in the prior art voltage generator of FIG. 1c is quantized and is sensitive to any mask defect which shorts one of the N+M transistors. But in the present invention, reference voltage $V_R$ is not quantized; and further, the invention includes only one gate whose length $L_1$ is substantially greater than the gate length of any of the individual N+M transistors and thus is not subject to shorting due to mask defects.

Referring now to FIG. 3, a second embodiment 60 of the invention will be described. This embodiment includes a substrate 61, a source 62, a drain 63, an elongated channel portion 64, a gate 65, and a conductive region 66 all of which are similar to the previously described components 51–56 respectively. Also, the elongated channel portion 64 has a predetermined length $L_1$, and conductive region 66 is centered at a predetermined length $L_2$ from source 62 to thereby pick-off reference voltage $V_R$ from the channel as a function of the ratio $L_1/L_2$. But in the FIG. 3 embodiment, the elongated channel portion 64 has a U-shape, and gate 65 has one side 65a which aligns with both ends of that channel portion.

Due to this U-shaped channel, reference voltage $V_R$ of the FIG. 3 embodiment is less sensitive to misalignment tolerances between the gate and the conductive region which picks off the reference voltage than is the previously described embodiment of FIG. 2. Consider for example, the affect on the reference voltage which occurs if gate 65 is moved upward toward source 62 and drain 63 by an amount $\Delta L$. Under those conditions, the predetermined length $L_2$ increases by the amount $\Delta L$ which tends to increase reference voltage $V_R$; however, the predetermined length $L_1$ also increases by an amount of $2 \times \Delta L$, which tends to decrease reference voltage $V_R$. Since these two tendencies are opposites, the net affect is that they partially cancel each other and thereby stabilize the reference voltage.

By comparison, if gate 55 of the FIG. 2 embodiment is moved towards drain 53 due to misalignment, then the predetermined length $L_2$ decreases by the amount $\Delta L$ while the predetermined length $L_1$ remains unchanged. Thus, reference voltage $V_R$ will reflect the degree to which conductive region 56 and gate 55 are misaligned with one another.

It is important to realize however, that any misalignment between conductive region 56 and gate 55 is caused by only one factor—that is the degree to which a mask which defines gate 55 can be registered with respect to conductive region 56. Thus, the misalignment tolerance can be readily controlled by using extra care at only one step of the fabrication process. Further, the misalignment tolerance between gate 55 and conductive region 56 may be made negligibly small by utilizing modern projection alignment techniques. By comparison, dimensional tolerances are caused by multiple factors at many steps during the fabrication process, and thus they are much more difficult to control.

Still another embodiment 70 of the invention is illustrated in FIG. 4. This embodiment also includes a substrate 71 having a major surface, a source 72, a drain 73, a channel having an elongated portion 74 of length $L_1$, a gate 75, and a conductive region 76 which contacts the elongated channel portion 74 at a predetermined length $L_2$ from one end of it. Components 71-76 are all similar in their structure and operation to the previously described components 61-66, and 51-56. In addition however, the embodiment of FIG. 4 further includes a region 77 and a region 78 in the channel. Region 77 has a width of $$\frac{W(L_1 - L_2)}{L_2};$$

and it is in contact with one end of the elongated channel portion 74 and extends to source 72. The other region 78 in the channel has a width W; and it is in contact with the opposite end of the elongated channel portion 74 and extends therefrom to drain 73.

Due to the inclusion of regions 77 and 78 in channel 74, reference voltage $V_R$ on conductive region 76 is insensitive to any misalignment between that conductive region and gate 75. Suppose for example that the length of regions 77 and 78 is an unknown quantity "X" due to misalignment of gate 75 with conductive region 76. Under those conditions, the resistance of region 78 is proportional to X/W; and the resistance of region 77 is proportional to $$X \div \frac{W(L_1 - L_2)}{L_2}.$$

Similarly, the resistance of the elongated channel portion of length $L_1$ is proportional to $L_1/W$; and the resistance of the channel portion of length $L_2$ is proportional to $L_2/W$.

Utilizing these expressions for resistance of the various portions of the channel, reference voltage $V_R$ may be expressed as:

$$V_R = \frac{\frac{L_2}{W} + \frac{X}{W}\left(\frac{L_2}{L_1 - L_2}\right)}{\frac{L_1}{W} + \frac{X}{W} + \frac{X}{W}\left(\frac{L_2}{L_1 - L_2}\right)}.$$

This equation may be simplified by cancelling the term W, and by multiplying the numerator and denominator by $L_1 - L_2$. This yields $$V_R = \frac{L_2(L_1 - L_2) + XL_2}{L_1(L_1 - L_2) + XL_1}.$$

The above expression may be further simplified by factoring $L_2$ out as a common term in the numerator, and by factoring $L_1$ out as a common term in the denominator. This leaves the term $(L_1 - L_2 + X)$ in both the numerator and the denominator which cancel out. Thus, voltage $V_R$ on conductive lead 76 is independent of any misalignment X and is merely a function of $L_1/L_2$.

Still another embodiment 80 of the invention will now be described in conjunction with FIG. 5. This embodiment is also similar to the previously described embodiments of FIGS. 2-4 in that it is fabricated on the surface of the semiconductor substrate 81, includes a source 82, a drain 83, a channel having an elongated portion 84 of a length $L_1$ and a width W, a gate 85, and a conductive region 86 which contacts the elongated channel portion 84 at a predetermined length $L_2$ from one end thereof to pick off the reference voltage $V_R$. In addition however, embodiment 80 further includes a pair of regions 87 and 88 in the channel which are substantially wider and substantially shorter than the elongated channel portion 84. Regions 87 and 88 contact respective ends of the elongated channel portion, and extend to opposite sides of the gate.

Due to the relatively large width of regions 87 and 88, their resistance is negligible in comparison to the resistance of the elongated channel portion 84. Accordingly, essentially no voltage is dropped across regions 87 and 88; and thus reference voltage $V_R$ is not a function of any misalignment between gate 84 and conductive region 86.

Various preferred embodiments of the invention have now been described in detail. In addition, many changes and modifications may be made to these details without departing from the nature and spirit of the invention. Thus, it is to be understood that the invention is not to be limited to said details but as defined by the appended claims.

What is claimed is:

1. A semiconductor device for providing a selectable reference voltage; said device being comprised of:
   a semiconductor substrate doped with atoms of a first conductivity type and having a major surface;
   a channel having input and output terminals, and having an elongated portion of a first predetermined length $L_1$ and a uniform width W in said substrate near said surface for passing current between said terminals;
   a single gate on an insulating layer completely overlying said channel; and
   a conductive region in said substrate near said surface doped with atoms of a conductivity type opposite to said first type, contacting the elongated portion of said channel at a predetermined length $L_2$ from one end thereof, to pick-off said reference voltage as generated by said current in said channel as a function of the ratio $L_1/L_2$.

2. A semiconductor device according to claim 1 wherein said channel has a linear shape, and said gate has a pair of spaced apart sides which are respectively aligned with opposite ends of said channel.

3. A semiconductor device according to claim 2 and further including a pair of regions in said channel which are substantially wider and substantially shorter than said elongated channel portion and which contact respective ends of said elongated channel portion and extend to opposite sides of said gate.

4. A semiconductor device according to claim 1 wherein said channel has a curved shape and said gate has one side which aligns with both ends of said channel.

5. A semiconductor device according to claim 4 and further including a region in said channel having a width of $$W \frac{(L_1 - L_2)}{L_2}$$

in contact with said one end of said elongated channel portion and extending to said side of said gate, and another region in said channel having a width W in contact with the opposite end of said elongated channel portion and extending to said side of said gate.

6. A semiconductor device according to claim 4 and further including a pair of regions in said channel which are substantially wider and substantially shorter than said elongated channel portion, and which contact respective ends of said elongated channel portion and extend to said side of said gate.

7. A semiconductor device according to claim 1 wherein said semiconductor substrate is P-type.

8. A semiconductor device according to claim 1 wherein said semiconductor substrate is N-type.

9. A semiconductor device according to claim 1 wherein said channel and said substrate both contain dopant impurity atoms and the majority charge carriers in said channel are of the same conductivity type as in said substrate.

10. A semiconductor device according to claim 1 wherein said channel and said substrate both contain dopant impurity atoms and the majority charge carriers in said channel are of the opposite conductivity type as in said substrate.

* * * * *